United States Patent [19]

Brahmbhatt

[11] Patent Number: 5,791,486
[45] Date of Patent: Aug. 11, 1998

[54] INTEGRATED CIRCUIT TRAY WITH SELF ALIGNING POCKET

[75] Inventor: Saumil R. Brahmbhatt, Chanhassen, Minn.

[73] Assignee: Fluoroware, Inc., Chaska, Minn.

[21] Appl. No.: 779,482

[22] Filed: Jan. 7, 1997

[51] Int. Cl.⁶ .................................................. B65D 73/02
[52] U.S. Cl. ........................ 206/725; 206/509; 206/592; 439/331
[58] Field of Search ........................... 206/701, 706, 206/707, 709, 722–726, 453, 455, 509, 557, 564, 586, 591, 821, 592; 439/330, 331, 526

[56] References Cited

U.S. PATENT DOCUMENTS

| | | |
|---|---|---|
| D. 331,803 | 12/1992 | Murphy et al. . |
| 4,681,221 | 7/1987 | Chickanosky et al. ........... 206/724 |
| 5,000,697 | 3/1991 | Murphy . |
| 5,066,245 | 11/1991 | Walker ............................. 206/724 |
| 5,080,228 | 1/1992 | Maston, III et al. . |
| 5,103,976 | 4/1992 | Murphy . |
| 5,109,981 | 5/1992 | Maston, III et al. . |
| 5,238,110 | 8/1993 | Ye . |
| 5,301,416 | 4/1994 | Foerstel ............................ 439/330 |
| 5,335,771 | 8/1994 | Murphy . |
| 5,375,710 | 12/1994 | Hayakawa et al. . |
| 5,387,120 | 2/1995 | Marks et al. ..................... 439/331 |
| 5,400,904 | 3/1995 | Maston, III et al. . |
| 5,450,959 | 9/1995 | Philippi ............................ 206/709 |
| 5,490,795 | 2/1996 | Hetzel et al. ..................... 439/331 |
| 5,551,572 | 9/1996 | Nemoto . |

Primary Examiner—Paul T. Sewell
Assistant Examiner—Luan K. Bui
Attorney, Agent, or Firm—Palmatier, Sjoquist, Voigt & Christensen, P.A.

[57] ABSTRACT

A tray for storing an integrated circuit component has an upper side and an array of terminals on a bottom side, four side walls, and four corners. The tray has a substantially planar base having a top surface and a bottom surface and a periphery. A plurality of pocket areas are formed in the top surface of the base within the periphery, each pocket area adapted to hold an integrated circuit component and to center the integrated circuit component within the pocket area. Each pocket area further comprising a plurality of corner guides with component engagement members contacting and supporting the integrated circuit component at the four principal corner portions thereof and the corner guides preventing further contact between the integrated circuit component and the base. The component engagement members supporting the integrated circuit component at its intersection of the side surfaces and bottom surface. The component engagement members comprise an angled guide-in portion and a seating surface portion. The angled guide-in portions extending to the seating portions for positioning and repeatedly properly centering the packages. The seating surface portions are obliquely positioned with respect to the bottom side of the component when the component is properly seated.

17 Claims, 4 Drawing Sheets

INTEGRATED CIRCUIT TRAY WITH SELF ALIGNING POCKET

BACKGROUND OF THE INVENTION

This invention relates to integrated circuit components. More particularly the invention relates to trays for holding, handling, and transporting such components.

The holding, handling, and transporting of integrated circuit components and packages are important considerations in the production of electronic assemblies. As semiconductors have grown in complexity, they have become highly susceptible to damage from external influences, such a contaminants, mechanical shock, electrostatic discharges, and physical contact. Trays for holding, handling, and transporting integrated circuit packages are commonly called matrix trays and are generally formed of injection molded plastic. Trays for holding bare dies or processed wafers cut into individual components which are not encapsulated are often termed chip trays.

Integrated circuit components which must be properly handled, stored, and transported include the following components: pin grid array (PGA), bare die, bump die, non-radial chip scale packing, ball grid arrays (BGA) and other leadless chip packages. These packages typically have a square or rectangular periphery with a flat upper surface, a flat lower surface and generally have a relatively thin planar housing. Four side surfaces extend around the rectangular periphery. A lower peripheral corner extends around the periphery at the intersection of the side walls and lower surface.

The ball grid array (BGA) is currently a popular integrated circuit package. BGA integrated circuits are characterized by the thin planar housing and a plurality of external terminals on the lower surface of the housing. Each external terminal comprises a small solder ball. Like earlier pin grid array (PGA) integrated circuit packages, the solder ball terminals in a BGA integrated circuit package can be arranged in a two-dimensional array. However, the terminal density in a BGA integrated circuit package is greater than attainable with PGA integrated circuit packages.

It is important to have a component tray usable by integrated circuit package manufacturers and customers, particularly BGA packages, that protects the integrated circuit component from damage. The tray needs to provide repeatable positioning of the integrated circuit component in the tray to facilitate automated assembly and testing. The trays should store multiple BGA integrated circuit component and should stack with other trays to facilitate bulk transport and storage. The trays need to have pockets on the top and bottom sides of the tray to constrain the component with either the component's upper side up when placed in a pocket on the top of the tray or with the component's lower side up when placed in a pocket on the bottom side of the tray.

Earlier trays for the transportation of BGA integrated circuit packages do not adequately protect the BGA integrated circuit package because the trays do not adequately prevent contact between the tray and the solder ball terminals. Either the trays support the BGA integrated circuit package at the center of the BGA integrated circuit package, contacting the terminals, or they support the BGA integrated circuit package along the peripheral bottom surface of the BGA integrated circuit package, again allowing possible contact with the solder ball terminals particularly in view of the tolerances built into such tray and also the components.

Moreover, earlier trays utilize vertical side walls of other structures with vertical engagement surfaces which constrain the lateral movement of the component in the pocket. Such pockets have tolerances built into the pocket dimensions such that the components in said pockets may move laterally. During testing or pickup of a component a step to scan the component to determine its exact position before pickup or testing is often necessary due to the built-in dimensional tolerances of pockets.

U.S. Pat. No. 5,400,904 (Maston et al) shows a tray for a BGA integrated circuit package which supports the package by tabs which contact the solder ball terminal surface of the BGA integrated circuit package. U.S. Pat. No. 5,375,710 (Hayakawa et al) shows a tray for integrated circuits which supports the lower surfaces of central portions of two corresponding sets of opposite sides of an integrated circuit package body and further supports the terminals. U.S. Pat. No. 5,335,771 (Murphy) shows a tray for a PGA integrated circuit package which supports the package by ribs that contact the terminal surface of the package between terminal pins. This is unsuitable for BGA packages, where the spacing between solder ball terminals is very much denser. U.S. Pat. No. 5,551,572 (Nemoto) shows a tray for semiconductor devices which supports the semiconductor device by supporting step portions having a flat engagement surface parallel to the lower surface of the package supporting the outer peripheral lower surface of the semiconductor device. Portions of the step portions are cut away to accommodate the outer peripheral solder balls. Again, with the very dense spacing of solder ball terminals, such supports may still contact the solder ball terminals and also require a complicated shape of the supports which are specific to a particular ball grid array. U.S. Pat. No. 5,238,110 (Ye) shows a plastic leaded chip carrier which supports a chip by means of a pad in the center of the chip cavity, which would contact BGA solder ball terminals.

There is a need for a tray for storing an integrated circuit component, such as a BGA integrated circuit package, which supports the integrated circuit component with minimal contact with the bottom surface, no contact with the terminals, and at the same time centers the integrated circuit component within a pocket, so that automated test and assembly equipment may easily locate the integrated circuit component and its terminals while accommodating packages with different arrays of terminals. The tray should store a number of integrated circuit components. The tray should have apertures in each pocket to allow access to the terminals of the integrated circuit component for testing. The trays should also be stackable and stacking members should be provided to prevent lateral motion of the trays relative to each other when stacked.

SUMMARY OF THE INVENTION

A tray for storing an integrated circuit component has an upper side and an array of terminals on a bottom side, four side walls, and four corners. The tray has a substantially planar base having a top surface and a bottom surface and a periphery. A plurality of pocket areas are formed in the top surface of the base within the periphery, each pocket area adapted to hold an integrated circuit component and to center the integrated circuit component within the pocket area. Each pocket area further comprising a plurality of corner guides with component engagement members contacting and supporting the integrated circuit component at the four principal corner portions thereof and the corner guides preventing further contact between the integrated circuit component and the base. The component engagement members supporting the integrated circuit component at its intersection of the side surfaces and bottom surface. The component engagement members comprise an angled guide-in portion and a seating surface portion. The angled guide-in portions extending to the seating portions for positioning and repeatedly properly centering the packages. The seating surface portions are obliquely positioned with respect to the bottom side of the component when the component is properly seated.

A principal object and advantage of the present invention is that it supports the integrated circuit component at the lower peripheral corners of the package, thus preventing any contact between the tray and the terminals of the integrated circuit component.

A second principal object and advantage of the present invention is that it automatically centers the integrated circuit component within a pocket in the tray, so that automated test and assembly equipment can precisely locate the integrated circuit component and its terminals. The invention provides centering in pockets on both the top side and bottom side of the tray.

Another advantage of the invention is that the angled guide-in surface portion extending all the way to the seating surface allows a thinner tray as compared to configurations with a guide-in surface extending to vertical surfaces which confront the components side surfaces. The thinner tray allows greater stacking densities and uses less material for the tray.

A feature of a preferred embodiment the present invention is that the side walls of each corner of each pocket have a complex curvature whereby at the corner, a first side wall is essentially perpendicular to the tray base. As the side wall extends away from the corner it becomes progressively more angular to where it intersects another surface nearly upright with respect to the tray base and extending away from the package side surface. The two surfaces provide a guide-in portion configured as a ridge extending to the package seating position. This structure facilitates a self-centering effect for the integrated circuit component in the pocket, provides minimal contact by the tray with the integrated circuit component when being guided to the seating position and when seated, and also provides an easily molded structure.

DETAILED DESCRIPTION OF THE PREFERRED EMBODIMENTS

Figure 1:
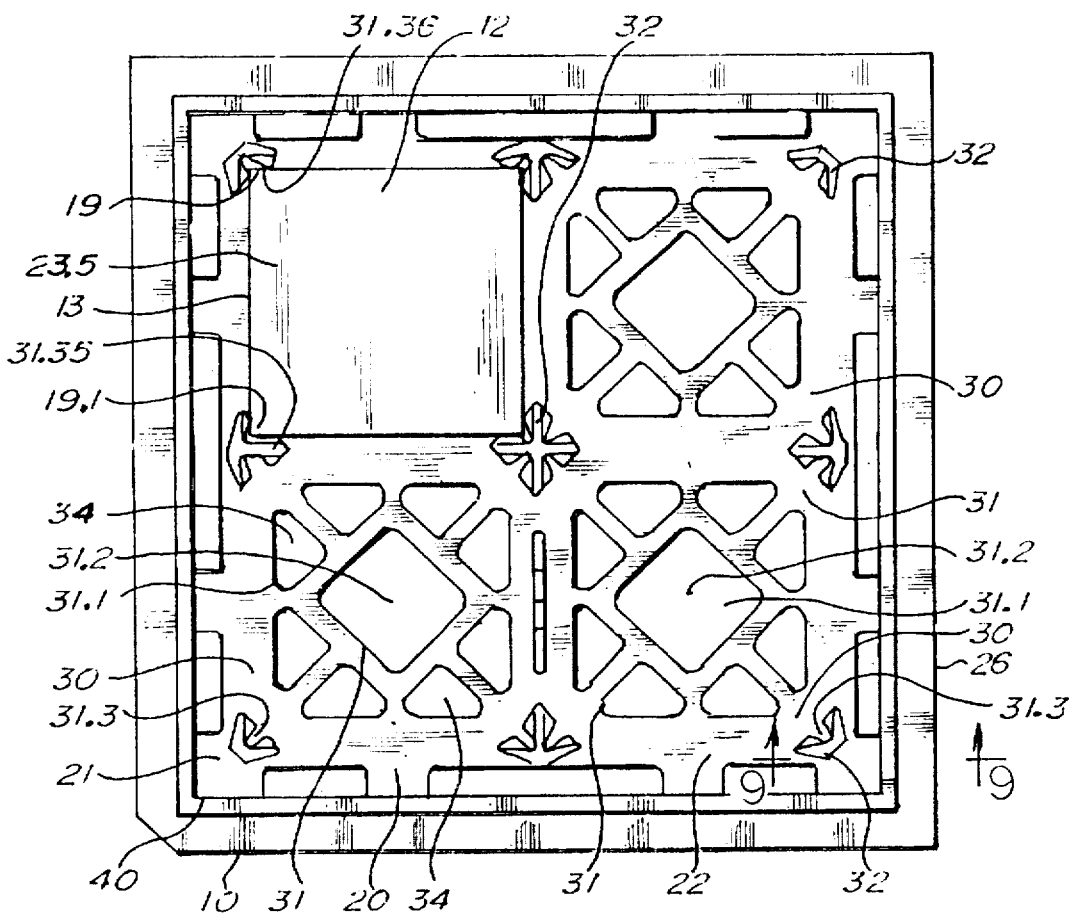
FIG. 1 is a top plan view of the integrated circuit tray of the present invention with an integrated circuit inserted in one of the pockets.
Figure 9:
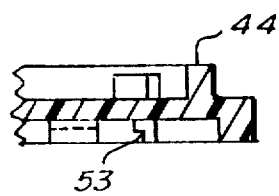
FIG. 9 is a cross-section of the tray of the present invention along the lines 9—9 of FIG. 1, showing detail of the stacking tabs and the support tabs which contact the upper surface of the integrated circuit component when the trays are stacked.
Figure 10:
FIG. 10 is a side elevational view of two trays stacked.

The integrated circuit tray of the present invention is generally designated in the Figures by reference numeral 10.

Figures 3, 4:
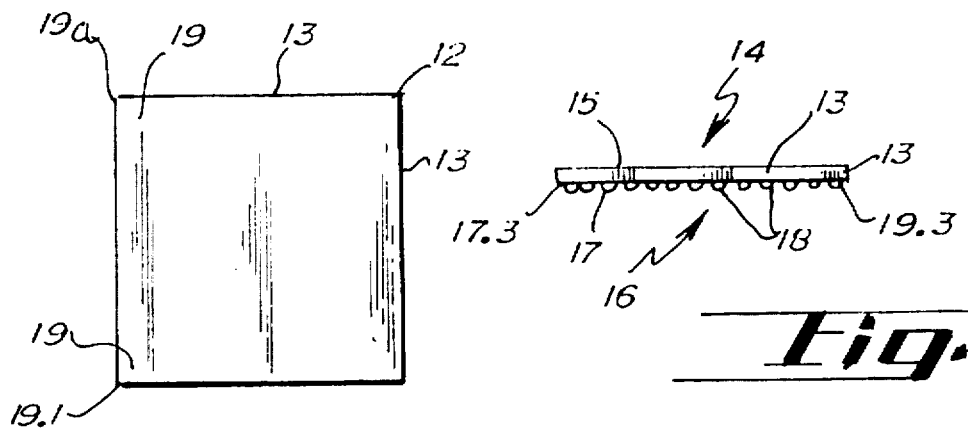
FIG. 3 is a plan view of an integrated circuit package.
FIG. 4 is a side elevational view of the integrated circuit package of FIG. 3.

Referring to FIGS. 3 and 4 the integrated circuit tray holds a number of integrated circuit components 12 such as ball grid arrays (BGA) or pin grid arrays (PGA). Each integrated circuit has four side surfaces 13, an upper side 14 with a upper planar surface 15, and a lower side 16 with a lower planar surface 17, and an array of terminals 18 on the lower side 16. The integrated circuit component has corners 19, each of which has a tip 19.1, and a lower peripheral corner 19.3 at the intersection of the side surfaces 13 and the surface 17.

Referring to FIGS. 1, 2, 5, and 7, the integrated circuit tray 10 comprises a substantially planar base 20. The base 20 has a top side 21 with a top surface 22, a bottom side 23 with a bottom surface 24, and a periphery 26.

A plurality of pocket means 30 for holding the integrated circuit components 12 and centering the integrated circuit components 12 within the pocket means 30 are formed in the top surface 22 of the base 20 within the periphery 26. Each pocket means is preferably a pocket area 31 having an interior 31.1, a center 31.2, and a pocket corner 31.3.

Each pocket means 30 further comprises a plurality of corner centering means 32 for contacting and supporting the integrated circuit component 12 only at the corners 19. The corner centering means 32 also prevents contact between the integrated circuit component 12 and the base 20 at points other than the corners 19. Preferably, the corner centering means are corner guides 60, as will be described in detail below.

The integrated circuit tray 10 may also have a plurality of access apertures 34 in the pocket means 30 to allow access to the terminals 18 of the integrated circuit component 12.

Referring to FIGS. 1, 2, 9, and 10, the integrated circuit tray 10 may also preferably comprise an engagement member configured as a stacking member 40 on the top surface 22 of the base 20 and a cooperative engagement member configured as a stacking recessed or slotted portion 42 on the bottom surface 24 of the base 20. The stacking member 40 of a first, lower tray engages the stacking recess portion 42 of a second, upper tray, thereby allowing the trays to be stacked and preventing lateral motion of the trays with respect to each other. In the preferred embodiment, the stacking member 40 comprises a wall 44 rising substantially vertically above the top surface 22. Most preferably, the wall 44 encircles the pocket means 30 around the periphery 26 of the base 20 for ease of manufacture and to assure that lateral motion of the trays in any direction is prevented.

Figure 13:
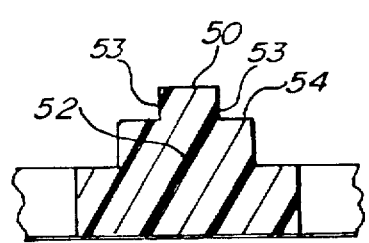
FIG. 13 is a cross-sectional view of a support member on the bottom side of the tray of FIG. 2, taken at line 13—13.
Figure 2:
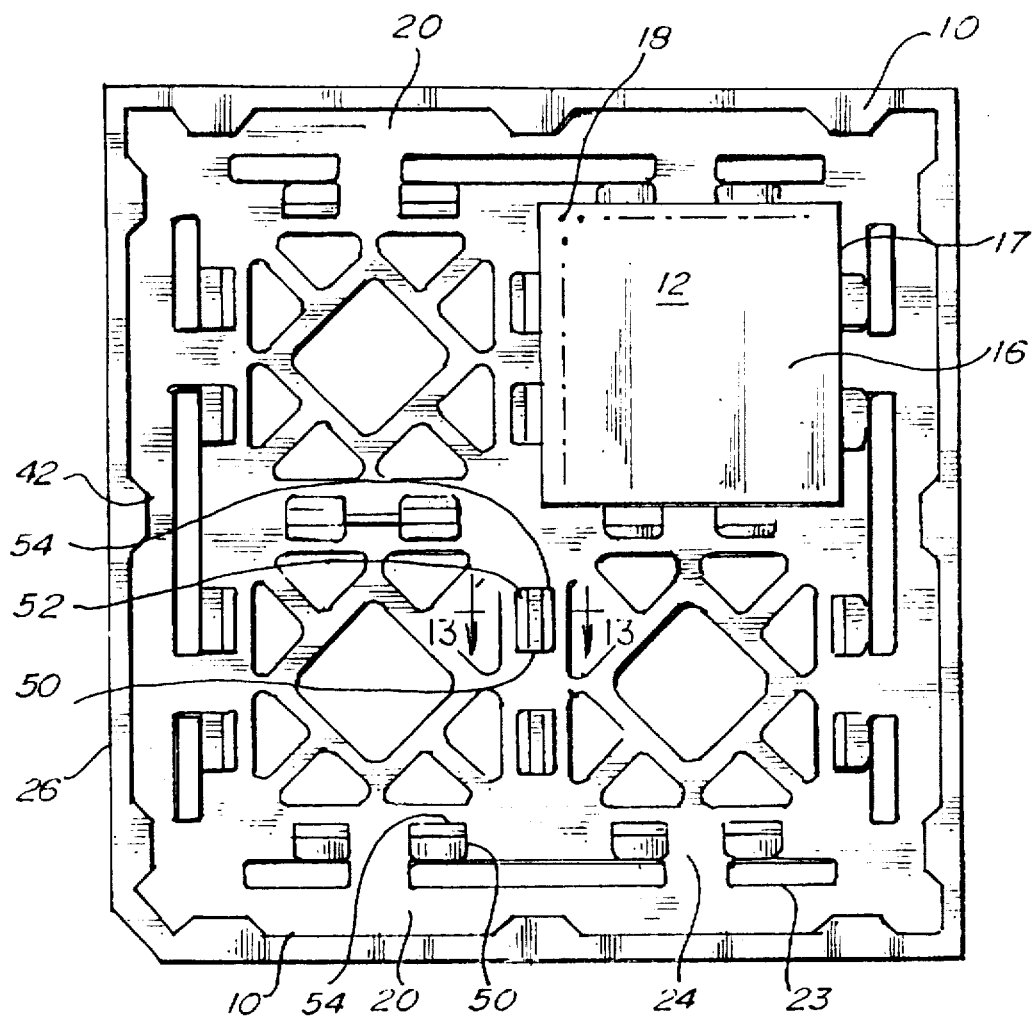
FIG. 2 is a bottom plan view of the integrated circuit tray of the present invention with an integrated circuit resting on the bottom surface of a tray when the trays are stacked.

Referring to FIGS. 2 and 13, the integrated circuit tray 10 may also preferably comprise a plurality of component engagement members configured as holding tabs 50 on the bottom surface 24 of the base 20, the holding tabs 50 contacting the upper side 14 of the integrated circuit component 12 when the trays are stacked. When the component is placed up side down in the bottom side the engagement members prevent any motion of the integrated circuit component 12 out of the pocket means 30 on the bottom side 23. The holding tabs 50 preferably comprise a tab body portion 52, a vertical surface 53, and a tab shelf portion 54 which makes contact with the integrated circuit component 12.

Detailed construction of the corner centering means 32, is shown in FIGS. 5, 6, 7, and 8. In the embodiment shown of FIGS. 5, 6, and 7, the corner centering means 32 at each pocket corner 31.3 comprises a corner guide 60 which is V-shaped and further comprises two component engagement members configured as a first arm 62 and a second arm 64, the first arm 62 joining the second arm 64 at a junction 66. Both the first arm 62 and second arm 64 have an inner first face 68 facing the interior 31.1 of the pocket area 31 and a second face 69 generally upright and intersecting the first face 68 at a ridge 69.1. The support of the component 12 is by this ridge 69.1. The ridge constitutes an inclined component contact portion 69.2 with a guide-in portion 69.3, a seating portion 69.4, which in this embodiment is essentially a point contact, and a subordinate portion 69.5 below the seating portion 69.4. The ridge 69.1 may be slightly rounded.

Face 69.7 adjacent to the junction 66 is substantially vertical, perpendicular to the base 20. That portion 70 of the inner surface 68 adjacent the junction 66 is also substantially perpendicular to the base 20. That portion 72 of the inner surface 68 distal to the junction 66 is at an acute angle α to the base 20. The angle between the inner surface 68 and the base 20 progressively increases to substantially perpendicular as the junction 66 is approached.

Figure 7:
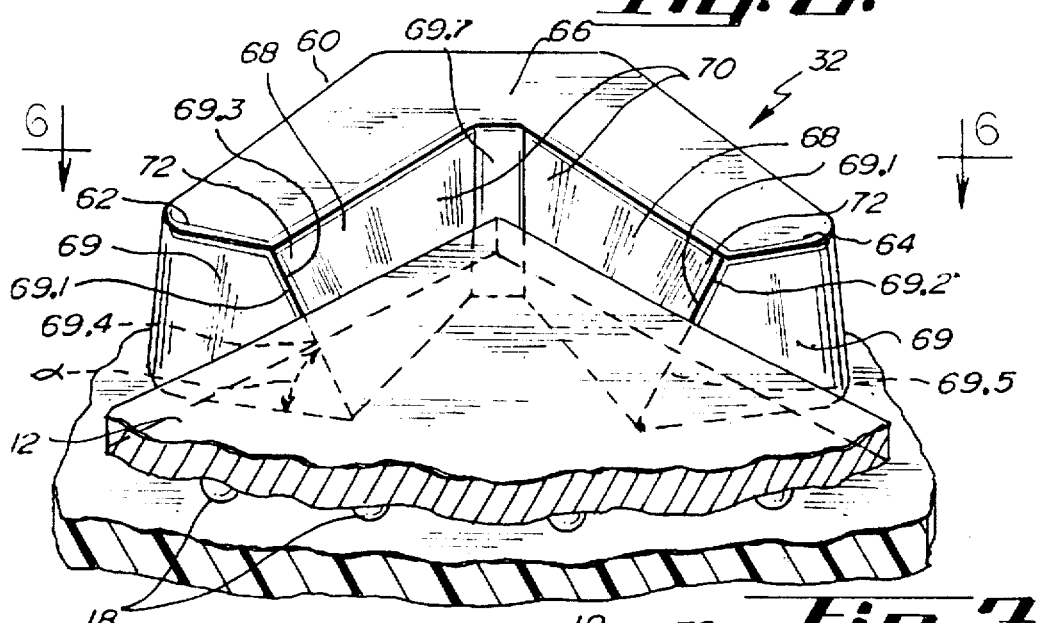
FIG. 7 is a detailed perspective view of a pocket corner with a BGA component in place.

As seen in FIG. 7, the inner first faces 68 and second faces 69 thus cooperate to form an intersection shaped as a ridge 69.1 to support the lower peripheral corner 19.3 of the integrated surface component 12 and to center the corner 19 between the first arm 62 and the second arm 64. More specifically, when the integrated circuit component 12 is placed in the pocket area 31, the corners 19 will slide downwardly and inwardly along the ridges 69.1 of the first arm and second arm until a point is reached at which further downward and inward motion of the component corner 19 is prevented by the ridges 69.1. Because the inner surfaces 68 have the same curvature, the corner 19 will come to rest centered between the first arm 62 and the second arm 64. Also, the curvature is such that at the seating position 64.6, the tip 19.1 of the corner 19 will be separated from the junction 66 so that the integrated circuit component 12 does not touch the junction 66.

Figure 17:
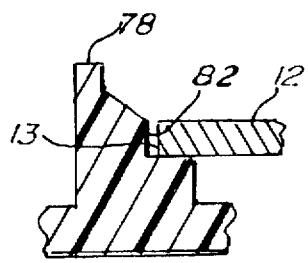
FIG. 17 is a cross-sectional view of a prior art component engagement member with a sloping guide-in surface and a vertical surface confronting the side surface of the component.
Figure 5:
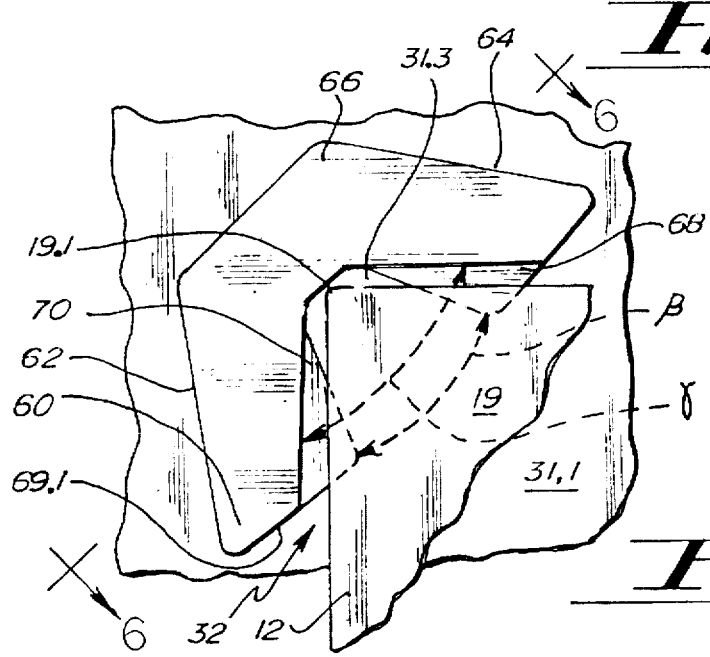
FIG. 5 is a top plan view of a pocket corner with a integrated circuit component on upper surface of a tray.
Figure 6:
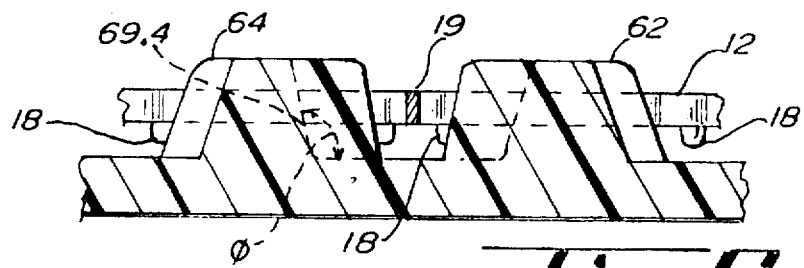
FIG. 6 is an enlarged detailed cross-section of one of the corners of a pocket along the lines 6—6 of FIG. 5 and FIG. 7, with an integrated circuit component shown in phantom.

Referring to FIGS. 5 and 7 the ridges 69.1 which constitutes the component contact portions of the component engagement members extend or angle toward the adjacent pocket corner 31.3 as said ridge 69.1 slopes toward the top surface 22. Although the ridge 69.1 is illustrated as linear it may also be curved. The orientation of the ridge, which is aligned intermediate the pocket corner 31.3 and the pocket center 31.2 (not shown in FIGS. 5 or 7) provides improved component seating beyond that of a ridge orientation directly perpendicular to the edge of the component and beyond that of inclined surface leading into a pocket with vertical side walls as shown in FIG. 17. The ridges 69.1 angling toward the pocket corner 31.3 urge the component corner downward and into the corner 31.3 for proper seating. Referring to FIG. 1, corresponding ridges 31.35, 31.36 on opposite sides of the pocket effectively operate as a shelf to prevent the side portion 23.5 of the component from falling far enough into the pocket for the solder balls 18 to contact the tray 10.

Most preferably, but not so limiting, the angle β between the first arm and the second arm adjacent the junction is approximately 80 degrees and the angle γ between the first arm and the second arm distal to the junction is approximately 50 degrees.

The tray 10 preferably has four corners 80, one of which 80.1 is chamfered to identify proper orientation of the tray for accessing the integrated circuit components by automated handling equipment.

Figure 11:
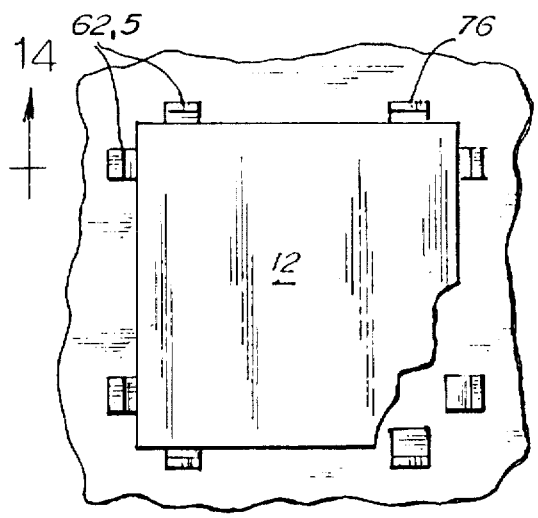
FIG. 11 is a top elevational view of an alternate embodiment of the invention showing a pocket defined by inclined component engagement members with planar contact surfaces.
Figure 14:
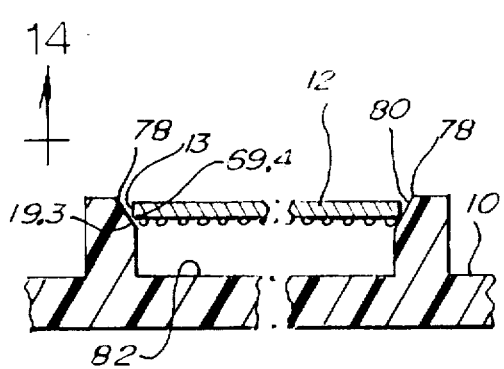
FIG. 14 is a cross-sectional view taken at lines 14—14 of FIG. 11 and FIG. 12.
Figure 15:
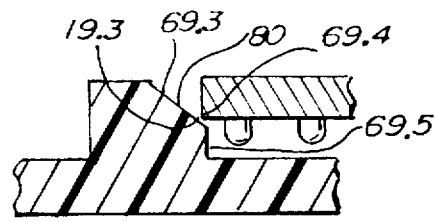
FIG. 15 is a cross-sectional view of an alternate configuration of a component engagement member.
Figure 12:
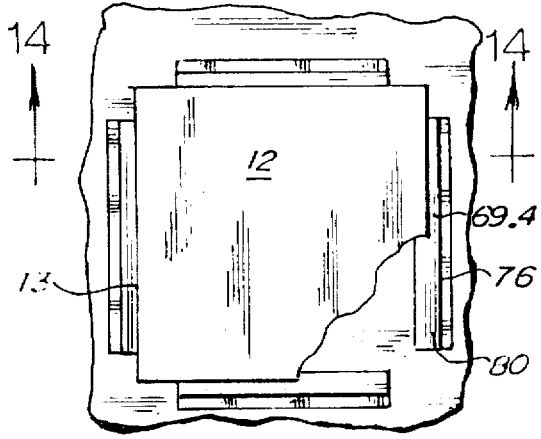
FIG. 12 is a top plan view of an alternate embodiment of the invention showing a pocket and inclined component engagement portions comprising a planar surface parallel to the component lower peripheral corner.

Referring to FIGS. 11, 12, 14, and 15, alternate embodiments within the scope of the invention are illustrated. FIGS. 11, 12, and 14 show component engagement members 76 that comprise a component contact portion 78 with surface 78.2 angled toward the surface 22 of the tray 10. The component contact portion surface 78.2 is parallel to the side surfaces 13 of the component when properly seated in the pocket 31.

Referring to the prior art FIG. 17, the embodiments above significantly do not have the vertical surface 82 which confronts and constrains the side surface 13 of the component 12. This allows a thinner tray thickness facilitating higher stacking densities, less material in the molded tray, and simpler and easier molding.

Figure 8:
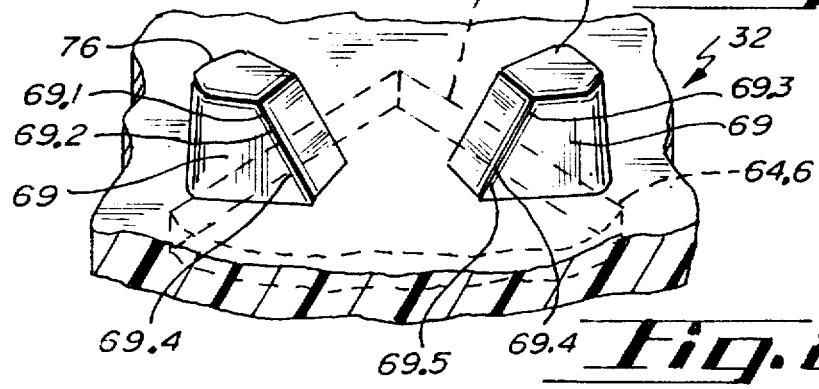
FIG. 8 is a detailed perspective view of a pocket corner with two component engagement members.
Figure 16:
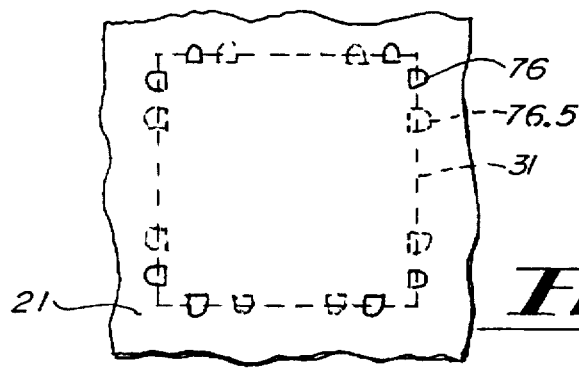
FIG. 16 is a top plan view of an alternate embodiment with discrete component engagement members with inclined contact portion on both the top side and bottom side of a tray.

Referring to FIGS. 8 and 16, it should be noted that the component engagement members 76 may be discrete with respect to each other. This is particularly useful for utilizing inclined component contact portions 69.2 on both the top and bottom of the tray 10. Such a configuration, as shown in FIG. 16, has contact engagement members 76 on the top side 21 and offset engagement members 76.5 on the bottom side 23 indicated by the dashed lines. Thus, when multiple trays are stacked the engagement members 76 on the top side do not interfere with the engagement members 76.5 on the bottom side and the component is positively and repeatedly positioned both with respect to the pocket on the top side and the pocket on the bottom side. This eliminates lateral movement and misalignment of the component when the component is either in a top side pocket or a bottom side pocket and facilitates robotic component removal and testing.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A tray for receiving and seating an integrated circuit component, the integrated component having an upper surface, a lower side with a lower planar surface, an array of terminals on said lower surface, four corners, a periphery with four side surfaces, the four sides surfaces transverse to and intersecting the lower surface at a lower peripheral corner extending around said component, the tray comprising:

- a substantially planar base having a top side with a top surface, a bottom side with a bottom surface, and a periphery,
- a plurality of component engagement members extending from said top surface and being integral with said top planar base, the engagement members positioned on said top surface to define a rectangular component pocket for receiving and confining said component, the pocket having an interior, four corners, and four sides, each of said component engagement members having a component contact portion with an incline sloping toward the interior of the pocket, the inclined component contact portion including a guide-in portion and a component seating portion, and a subordinate portion below the seating portion, said incline continuous through the guide-in portion, the seating portion, and the subordinate portion whereby when the component is engaged with the seating portion all contact with the component on the top side of the base is at the lower peripheral corner of the component.

2. An integrated circuit component tray according to claim 1 further comprising an upright first face and an upright second face intersecting at a ridge, said ridge comprising the inclined component contact portion.

3. An integrated circuit component tray according to claim 2, wherein the first face and the second face are positioned such that each component contact portion is angled toward the closest adjacent corner of the pocket.

4. An integrated circuit component tray according to claim 3, wherein each second face is transverse to the pocket side and said first face is intermediate said second face and the closest corner, and wherein said first face extends along a side of the pocket.

5. An integrated circuit component tray according to claim 1, wherein each component contact portion comprises a surface parallel to the closest lower peripheral edge of the component when in the seating position.

6. An integrated circuit component tray according to claim 5 wherein each component contact portion extends substantially the length of said closest lower peripheral edge.

7. An integrated circuit component tray according to claim 5, wherein there are two component contact portions on each side of the component pocket and wherein each of said two component contact portions are spaced from each other.

8. An integrated circuit component tray according to claim 7, wherein each component contact portion is adjacent a corner.

9. An integrated circuit component tray according to claim 1, wherein the bottom side of the tray has a pocket corresponding to the pocket on the top side, and wherein the top side and the bottom side have cooperating engagement members whereby a plurality of said trays may be vertically stacked with a component sandwiched between adjacent trays.

10. An integrated circuit component tray according to claim 9 wherein the cooperating engagement members on said bottom each have an inclined component contact portion.

11. A tray for receiving and seating an integrated circuit component, the integrated circuit component having an upper surface, a lower side with a lower planar surface, four corners, a periphery with four side surfaces, the four sides surfaces transverse to and intersecting the lower surface at a lower peripheral corner extending around said component, the tray comprising:

- a substantially planar base having a top side with a top surface, a plurality of component contact portions on the top side of said base and integral with said planar base, the component contact portions arranged in a rectangular configuration defining a component pocket, the contact portions having a component contact portion surface which engages the component when the component is properly seated, the contact portion surfaces each obliquely positioned with respect to the top surface of the tray when the component is properly seated.

12. An integrated circuit component tray according to claim 11, wherein each component contact portion further comprises a step with a component engagement surface parallel to the top surface of the tray.

13. An integrated circuit component tray according to claim 12, wherein the bottom side of the tray has a pocket corresponding to the pocket on the top side, and wherein the top side and the bottom side have cooperating engagement members whereby a plurality of said trays may be vertically stacked with a component sandwiched between adjacent trays.

14. An integrated circuit component tray according to claim 13 wherein said bottom side has a plurality of stepped engagement portions.

15. A component tray according to claim 13 wherein the bottom side has a plurality of component engagement members, each having an inclined component contact surface.

16. A tray for receiving and seating an integrated circuit component, the integrated component having an upper surface, a lower side with a lower planar surface, a periphery with a plurality of side surfaces, the sides surfaces transverse to and intersecting the lower surface at a lower peripheral corner extending around said component, the tray comprising:

- a substantially planar base having a top side with a top surface, a bottom side with a bottom surface, a periphery, and
- a plurality of component engagement portions extending from said top surface and being integral with said top planar base, the engagement portions positioned on said top surface to define a rectangular component pocket for receiving and confining said component, the pocket having an interior, four corners, and four sides, each of said component engagement portions having a pair of upright faces intersecting at a ridge, each ridge inclined toward the interior of the pocket, each inclined ridge including an inclined guide-in portion and an inclined component seating portion for supporting the component when the component is properly seated, whereby the inclined guide-in portions and the inclined component seating portion are laterally adjacent to the side surfaces of the component when said component is seated.

17. A integrated circuit component tray according to claim 16 wherein each component engagement portion is positioned adjacent to a pocket corner, and wherein each ridge is angled toward said adjacent pocket corner as it slopes toward the interior of the pocket.

* * * * *